United States Patent
Kim et al.

(10) Patent No.: US 12,322,439 B2
(45) Date of Patent: Jun. 3, 2025

(54) NEUROMORPHIC MEMORY CIRCUIT AND OPERATING METHOD THEROF

(71) Applicants: SAMSUNG ELECTRONICS CO., LTD., Suwon-si (KR); SNU R&DB FOUNDATION, Seoul (KR)

(72) Inventors: Sangbum Kim, Seoul (KR); Uicheol Shin, Seoul (KR); Suyeon Jang, Seoul (KR)

(73) Assignees: SAMSUNG ELECTRONICS CO., LTD., Suwon-si (KR); SNU R&DB FOUNDATION, Seoul (KR)

( * ) Notice: Subject to any disclaimer, the term of this patent is extended or adjusted under 35 U.S.C. 154(b) by 428 days.

(21) Appl. No.: 17/699,756

(22) Filed: Mar. 21, 2022

(65) Prior Publication Data

US 2023/0119915 A1    Apr. 20, 2023

(30) Foreign Application Priority Data

Oct. 15, 2021    (KR) .................. 10-2021-0137460

(51) Int. Cl.
*G11C 13/00* (2006.01)
*G11C 11/54* (2006.01)

(52) U.S. Cl.
CPC ............ *G11C 11/54* (2013.01); *G11C 13/003* (2013.01); *G11C 13/0061* (2013.01); *G11C 13/0004* (2013.01)

(58) Field of Classification Search
CPC ... G11C 11/54; G11C 13/003; G11C 13/0061; G11C 13/0004; G11C 11/161;
(Continued)

(56) References Cited

U.S. PATENT DOCUMENTS

| | | |
|---|---|---|
| 8,527,438 B2 | 9/2013 | Jackson et al. |
| 9,087,302 B2 | 7/2015 | Sim et al. |

(Continued)

FOREIGN PATENT DOCUMENTS

| | | |
|---|---|---|
| KR | 10-2017-0015560 A | 2/2017 |
| KR | 10-2017-0049192 A | 4/2017 |

(Continued)

OTHER PUBLICATIONS

Shen, Juncheng, et al., "Darwin: a neuromorphic hardware co-processor based on Spiking Neural Networks", Science China Information Sciences 59.2 (2016): pp. 1-5.

(Continued)

*Primary Examiner* — Mohammed A Bashar
(74) *Attorney, Agent, or Firm* — NSIP Law

(57) ABSTRACT

A neuromorphic memory circuit includes a plurality of memory cells, and each of the plurality of memory cells includes a first switching element having a threshold switching time determined based on a voltage applied to both ends of the first switching element at a time of receiving an input signal, and outputting the input signal in response to an elapse of the threshold switching time from a point in time at which the input signal is received; a first resistive memory element connected to the first switching element to divide the voltage applied to both ends of the first switching element; and a synapse circuit to generate an output signal in response to the input signal delayed by the threshold switching time.

20 Claims, 10 Drawing Sheets

(58) Field of Classification Search
CPC .... G11C 13/0002; G06N 3/065; G06N 3/049; G06N 3/088; G06N 3/063
See application file for complete search history.

(56) References Cited

U.S. PATENT DOCUMENTS

| | | |
|---|---|---|
| 9,953,261 B2 | 4/2018 | Friedman et al. |
| 10,056,907 B1* | 8/2018 | Asnaashari ........ H03K 19/1776 |
| 2011/0273926 A1* | 11/2011 | Wu .......................... G11C 11/54 |
| | | 365/158 |
| 2019/0019081 A1 | 1/2019 | Kim |
| 2021/0026601 A1 | 1/2021 | Kobayashi et al. |

FOREIGN PATENT DOCUMENTS

| | | |
|---|---|---|
| KR | 10-2017-0088877 A | 7/2017 |
| WO | WO 2021/171480 A1 | 9/2021 |

OTHER PUBLICATIONS

Chai, Zheng, et al., "Dependence of switching probability on operation conditions in $Ge_xSe_{1-x}$ ovonic threshold switching selectors", IEEE Electron Device Letters 40.8 (2019): (4 pages in English).

Shanks, R. Roy, "Ovonic Threshold Switching Characteristics", Journal of Non-Crystalline Solids 2, North Holland Publishing Co., Amsterdam, 1970, pp. 504-514.

Extended European Search Report Issued on Nov. 8, 2022, in counterpart European Patent Application No. 22173489.0 (11 Pages in English).

* cited by examiner

NEUROMORPHIC MEMORY CIRCUIT AND OPERATING METHOD THEROF

CROSS-REFERENCE TO RELATED APPLICATIONS

This application claims the benefit under 35 USC § 119(a) of Korean Patent Application No. 10-2021-0137460, filed on Oct. 15, 2021, in the Korean Intellectual Property Office, the entire disclosure of which is incorporated herein by reference for all purposes.

BACKGROUND

1. Field

The following description relates to a neuromorphic memory circuit.

2. Description of Related Art

In the current von Neumann computer architecture, frequent movement of huge data between a processor and a memory causes long delays and large power consumption, limiting chip performance. For current software-based deep neural network operations, artificial intelligence (AI) accelerator hardware such as a high-performance central processing unit (CPU), a graphics processing unit (GPU), or an application-specific integrated circuit (ASIC) is used.

A neuromorphic architecture may perform operations directly at a location in a memory device storing data, and store and update a connection strength (e.g., a synaptic weight) between neuron circuits in the memory device. A neuromorphic operation method may be applied to AI, big data, sensor network, pattern/object recognition, and the like. The neuromorphic architecture may be implemented by hardware using analog memory.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a neuromorphic memory circuit includes a plurality of memory cells, wherein each of the plurality of memory cells includes a first switching element configured to have a threshold switching time determined based on a voltage applied to both ends of the first switching element at a time of receiving an input signal, and to output the input signal in response to an elapse of the threshold switching time from a point in time at which the input signal is received, a first resistive memory element connected to the first switching element and configured to divide the voltage applied to both ends of the first switching element, and a synapse circuit configured to generate an output signal in response to the input signal delayed by the threshold switching time.

Each synapse circuit may include a second switching element connected to the first switching element and the first resistive memory element, and a second resistive memory element connected to the second switching element, wherein the synapse circuit may be configured to generate the output signal corresponding to a result of multiplication between an input value indicated by the input signal and a weight value corresponding to a resistance of the second resistive memory element.

The plurality of memory cells may include at least a first memory cell and a second memory cell, and a threshold switching time of the first memory cell may be different than a threshold switching time of the second memory cell.

Two or more memory cells, of the plurality of memory cells, disposed on a same input line may be configured to receive a same input signal, and a threshold switching time of at least one memory cell of the two or more memory cells may be different from a threshold switching time of another memory cell on the same input line.

One or more of the first switching elements may include one of an ovonic threshold switch (OTS), a switching element including a metal-insulator transition (MIT) material, a switching element including a mixed-ionic-electronic conduction material, and a metal-insulator-metal (MIM) switching element, or a combination of two or more thereof.

One or more of the first resistive memory elements may include a variable resistor.

One or more of the first resistive memory elements may include one of a phase change memory element, a resistive random access memory (ReRAM) element, a MIM variable resistor element, an electrochemical memory element, a conductive filament memory element, a capacitor, a dynamic RAM (DRAM), and a magnetic random access memory (MRAM) element, or a combination of two or more thereof.

At least one memory cell of the plurality of memory cells may include a resistance setting switch connected in series to the first resistive memory element.

The resistance setting switch may be configured to form an electrical path for setting a resistance of the first resistive memory element, the electrical path being disposed from an input line through the first switching element and the first resistive memory element, in response to a setting activation signal being received.

The resistance of the first resistive memory element may be set based on one a waveform, a width, a period, a repetition number, a pulse interval, and an amplitude of a resistance setting signal received through the input line, or a combination of two or more thereof.

At least one of the memory cells may include a capacitor connected to an output of the synapse circuit, and a comparator connected to the output of the synapse circuit and the capacitor and configured to output a neuron fire signal based on a comparison between a voltage according to electric charge stored in the capacitor and a threshold voltage.

The electric charge stored in the capacitor may be removed by an activated synapse circuit among synapse circuits of two or more memory cells connected on a same output line.

The first resistive memory element may be connected to a resistance setting line, and a resistance of the first resistive memory element may be set in response to a resistance setting signal received through at least one of an input line and the resistance setting line.

At least one of the memory cells may include a hold capacitor connected to an output of the first switching element.

The hold capacitor may be configured to maintain the voltage applied to the first switching element to be greater than or equal to a hold voltage while the first switching element receives the input signal.

At least one of the first switching elements may be configured to output the input signal delayed by a first threshold time in a case in which the voltage applied to the first switching element in response to the input signal is a first voltage, and to output the input signal delayed by a second threshold time that is greater than the first threshold time in a case in which the voltage applied to the first switching element in response to the input signal is a second voltage that is less than the first voltage.

A resistance of the first switching element may become less than a resistance of the first resistive memory element in response to an elapse of the threshold switching time from the point in time at which the input signal is received.

A resistance of the first switching element may be changed from a default resistance value to a reduced resistance value in response to an elapse of the threshold switching time after the input signal is received, and return from the reduced resistance value to the default resistance value in response to the voltage applied to the first switching element being less than a hold voltage.

In another general aspect, a neuromorphic memory circuit includes a first memory cell including a first synapse circuit, and a first delay circuit configured to delay transmission of an input to the first synapse circuit by a first threshold switching time, and a second memory cell including a second synapse circuit, and a second delay circuit configured to delay transmission of an input to the second synapse circuit by a second threshold switching time different from the first threshold switching time.

In another general aspect, an operating method of a neuromorphic memory circuit includes distributing a voltage corresponding to an input signal to a first switching element and a first resistive memory element in response to the input signal being received by a memory cell, transmitting the input signal to a synapse circuit in response to an elapse of a threshold switching time determined based on a voltage applied to both ends of the first switching element from a point in time at which the input signal is received, and generating an output signal by the synapse circuit in response to the input signal delayed by the threshold switching time.

In another general aspect, a neuromorphic memory circuit includes a plurality of memory cells arranged into a plurality of input lines and a plurality of output lines. Each of the memory cells arranged along a same input line has a different fire delay time and is configured to receive a same input signal and to output a respective output signal based on the respective fire delay time and the input signal, and output signals of each of the memory cells arranged along a same output line are added such that outputs of each of the output lines have different fire delays.

Each of the memory cells may include a first switching element, and the fire delay time of each memory cell may be determined based on a voltage applied to both ends of the respective first switching element at a time of receiving the input signal.

Each of the memory cells may include a synapse circuit configured to generate the respective output signal in response to the input signal delayed by the respective fire delay time.

The neuromorphic memory circuit may be implemented in the form of a crossbar array connecting a neuron circuit of a previous layer and a neuron circuit of a target layer in a neural network.

Other features and aspects will be apparent from the following detailed description, the drawings, and the claims.

Figure 1:
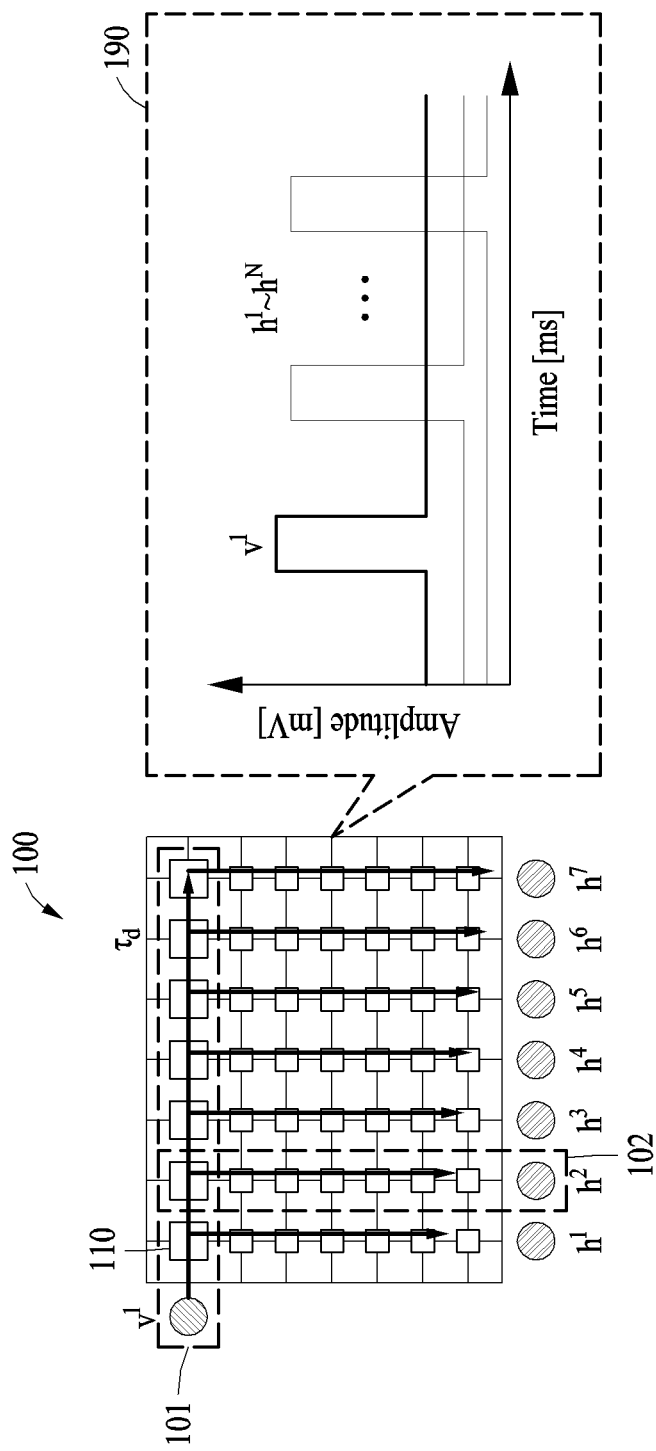
FIG. 1 illustrates an example of a neuromorphic memory circuit.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed structural or functional description is provided as an example only and various alterations and modifications may be made to the examples. Here, the examples are not construed as limited to the disclosure and should be understood to include all changes, equivalents, and replacements within the idea and the technical scope of the disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if it is described that one component is "connected", "coupled", or "joined" to another component, a third component may be "connected", "coupled", and "joined" between the first and second components, although the first component may be directly connected, coupled, or joined to the second component.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or populations thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, example embodiments will be described in detail with reference to the accompanying drawings. When describing the example embodiments with reference to the accompanying drawings, like reference numerals refer to like elements and a repeated description related thereto will be omitted.

FIG. 1 illustrates an example of a neuromorphic memory circuit.

Referring to FIG. 1, a neuromorphic memory circuit 100 may include a plurality of memory cells 110. The plurality of memory cells 110 may individually include a synapse circuit. The plurality of memory cells 110 may be arranged along input lines and output lines. The synapse circuits included in the plurality of memory cells 110 may be arranged in the form of an array along the input lines and output lines mentioned above, and may also be referred to as a neuromorphic synaptic array. The neuromorphic synaptic array may be implemented in the form of a crossbar array connecting a neuron circuit of a previous layer and a neuron circuit of a target layer in a neural network. The neural network may include a plurality of layers each having a plurality of nodes, and the previous layer may be a layer connected prior to the target layer in the neural network. The neuromorphic synaptic array may transmit a node value output from the neuron circuit of the previous layer to the neuron circuit of the target layer based on a connection strength (e.g., a synaptic weight) between the neuron circuits. A target neuron circuit of the target layer may receive a result of applying an activation function to a weighted sum based on weight values and node values received from previous neuron circuits of the previous layer connected to the target neuron circuit. A neuron circuit may be a circuit in which activation of neurons and/or an activation function of a neural network is implemented.

Each synapse circuit may provide an output in response to an input signal. For example, two or more memory cells 110 disposed on the same input line 101 may receive the same input signal (e.g., $v^1$) and provide outputs in response to the input signal. Outputs of two or more memory cells 110 disposed along the same output line 102 may be added up by the output line 102. In other words, each of the two or more memory cells 110 disposed along the same output line 102 may provide a result of multiplication of an input value indicated by the input signal received by the memory cell and a weight indicated by the memory cell. An output (e.g., $h^2$) of the output line 102 may be a result of a weighted sum of weight values and input values indicated by the input signal received by the two or more memory cells 110 disposed along the output line 102. The synapse circuit may include, for example, a memory element for synaptic plasticity and weight. The neuromorphic memory circuit 100 may access a memory element in the crossbar array through a switch (e.g., a transistor).

The neuromorphic memory circuit 100 may independently delay interneuron fires for individual memory cells. For example, a fire delay time $\tau_d$ of at least one of the plurality of memory cells 110 may be different from a fire delay time of another memory cell. The plurality of memory cells 110 may have different fire delay times. For example, FIG. 1 shows a result 190 in which an output $h^1$ of a first output line to an output $h^7$ of a seventh output line have all different fire delays.

The aforementioned neuromorphic memory circuit 100 may be implemented as a chip and applied to neuromorphic computing. The neuromorphic memory circuit 100 may be applied to the fields of brain science and neurobiology through emulation of biological neural networks. By means of the fire delay times that may be independently set for the memory cells described above, the neuromorphic memory circuit 100 may also be implemented for improved recognition of stochastic and/or random parts.

Figure 2:
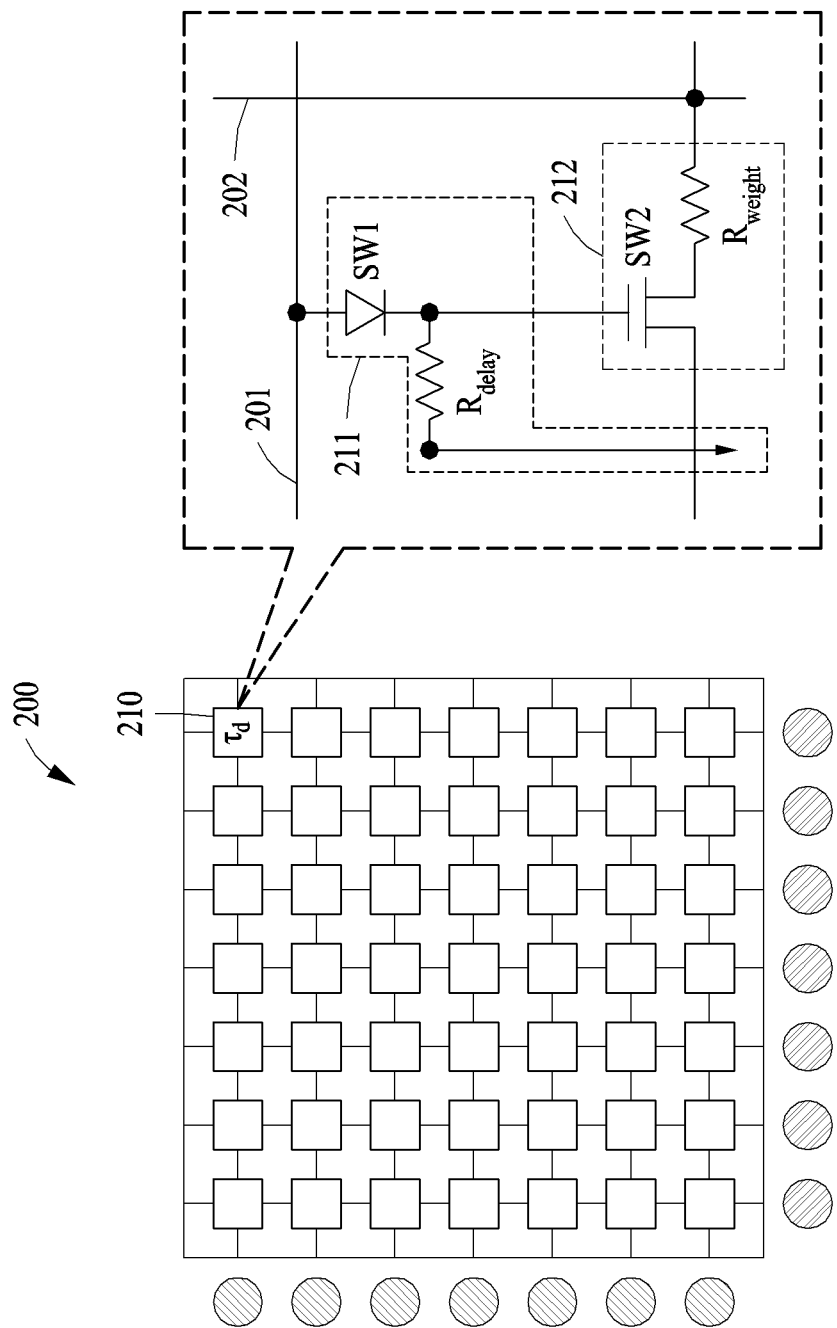
FIG. 2 illustrates an example of a memory cell included in a neuromorphic memory circuit.

FIG. 2 illustrates an example of a memory cell included in a neuromorphic memory circuit.

A neuromorphic memory circuit 200 may include a plurality of memory cells. Each of the plurality of memory cells may include a delay circuit 211 and a synapse circuit 212. FIG. 2 shows an example configuration of one memory cell 210 of the plurality of memory cells.

The delay circuit 211 may delay transmission of an input to the synapse circuit 212. The delay circuit 211 may include a first switching element SW1 and a first resistive memory element $R_{delay}$.

The first switching element SW1 may have a threshold switching time (e.g., the fire delay time of FIG. 1) determined based on a voltage applied to both ends thereof at a time of receiving an input signal. The threshold switching time of the first switching element SW1 may depend on the voltage applied to both ends of the first switching element SW1, and an operation of the first switching element SW1 will be described below with reference to FIG. 4. The first switching element SW1 may output the input signal in response to an elapse of the threshold switching time from a point in time at which the input signal is received. The input signal may be a signal transmitted to a memory cell disposed on an input line 201 (e.g., a word line) through the input line 201 from a neuron circuit of a previous layer.

The first resistive memory element $R_{delay}$ may be connected to the first switching element SW1. For example, the first resistive memory element $R_{delay}$ may be connected in series between the first switching element SW1 and a ground. The first resistive memory element $R_{delay}$ may divide the voltage applied to both ends of the first switching element SW1. The voltage corresponding to the input signal may be divided based on a resistance of the first switching element SW1 and a resistance of the first resistive memory element $R_{delay}$. For example, a portion of the voltage corresponding to the input signal may be applied to both ends of the first switching element SW1, and another portion of the voltage may be applied to the first resistive memory element $R_{delay}$. Thus, the voltage applied to both ends of the first switching element SW1 may be determined based on the resistance value of the first resistive memory element $R_{delay}$ and the resistance value of the first switching element SW1. The first resistive memory element $R_{delay}$ may include a variable resistor. The first resistive memory element $R_{delay}$ may include a non-volatile memory element and/or a volatile memory element. For example, the first resistive memory element $R_{delay}$ may include one of a phase change memory element, a resistive random access memory (ReRAM) element, a metal-insulator-metal (MIM) switching element, a MIM variable resistor element, an electrochemical random access memory (ECRAM) element, a conductive bridge RAM (CBRAM) element, a capacitor, a dynamic RAM (DRAM), and a magnetic random access memory (MRAM) element, or a combination of two or more thereof. However, the first resistive memory element $R_{delay}$ is not limited to the examples mentioned above, and various elements capable of changing the resistance may be applied thereto. An example of setting the resistance of the first resistive memory element $R_{delay}$ will be described below with reference to FIG. 3.

As described above, since the voltage distributed to the first switching element SW1 varies according to the resistance of the first resistive memory element $R_{delay}$, the threshold switching time of the first switching element SW1 may also vary according to the resistance of the first resistive memory element $R_{delay}$. A resistance of a first resistive memory element $R_{delay}$ of at least one of the plurality memory cells in the neuromorphic memory circuit 200 may be set to be different from a resistance of a first resistive memory element $R_{delay}$ of another memory cell. Thus, threshold switching times may be independently set for the respective memory cells.

The synapse circuit 212 may receive the input signal delayed by the delay circuit 211. The synapse circuit 212 may generate an output signal in response to the input signal delayed by the threshold switching time. For example, the synapse circuit 212 may be a multiplier for providing a result of multiplication between an input value indicated by the input signal and a weight value indicated by the synapse circuit 212. The synapse circuit 212 may include a second switching element SW2 and a second resistive memory element $R_{weight}$.

The second switching element SW2 may be connected to the first switching element SW1 and the first resistive memory element $R_{delay}$. The second switching element SW2 may include, for example, a transistor. A gate of the transistor may be connected to the first switching element SW1 and the first resistive memory element $R_{delay}$.

The second resistive memory element $R_{weight}$ may be connected to the second switching element SW2. For example, the second resistive memory element $R_{weight}$ may be connected in series between an output line 202 and the second switching element SW2. The second resistive memory element $R_{weight}$ may include a non-volatile memory element (e.g., a phase change memory element or a ReRAM) for storing a resistance value corresponding to the weight indicated by the memory cell.

The synapse circuit 212 may generate an output signal corresponding to a result of multiplication between the input value indicated by the input signal and a weight value corresponding to a resistance of the second resistive memory element $R_{weight}$. The output signal may be, for example, a current flowing through the second switching element SW2 activated by the input signal and the second resistive memory element $R_{weight}$.

According to an example, a first memory cell of the neuromorphic memory circuit 200 may include a first synapse circuit, and a first delay circuit for delaying transmission of an input to the first synapse circuit by a first threshold switching time. A second memory cell of the neuromorphic memory circuit 200 may include a second synapse circuit, and a second delay circuit for delaying transmission of the input to the second synapse circuit by a second threshold switching time different from the first threshold switching time.

A threshold switching time of at least one memory cell of the plurality of memory cells may be different from a threshold switching time of another memory cell. Of the plurality of memory cells, two or more memory cells disposed on the same input line may receive the same input signal. A threshold switching time of at least one memory cell of the two or more memory cells may be different from a threshold switching time of another memory cell on the same input line. When the first resistive memories of the memory cells have different resistances, the first switching elements may have different threshold switching times. Thus, even when two or more memory cells receive the same input signal on the same input line, the two or more memory cells may provide outputs with different fire delay times.

Figure 3:
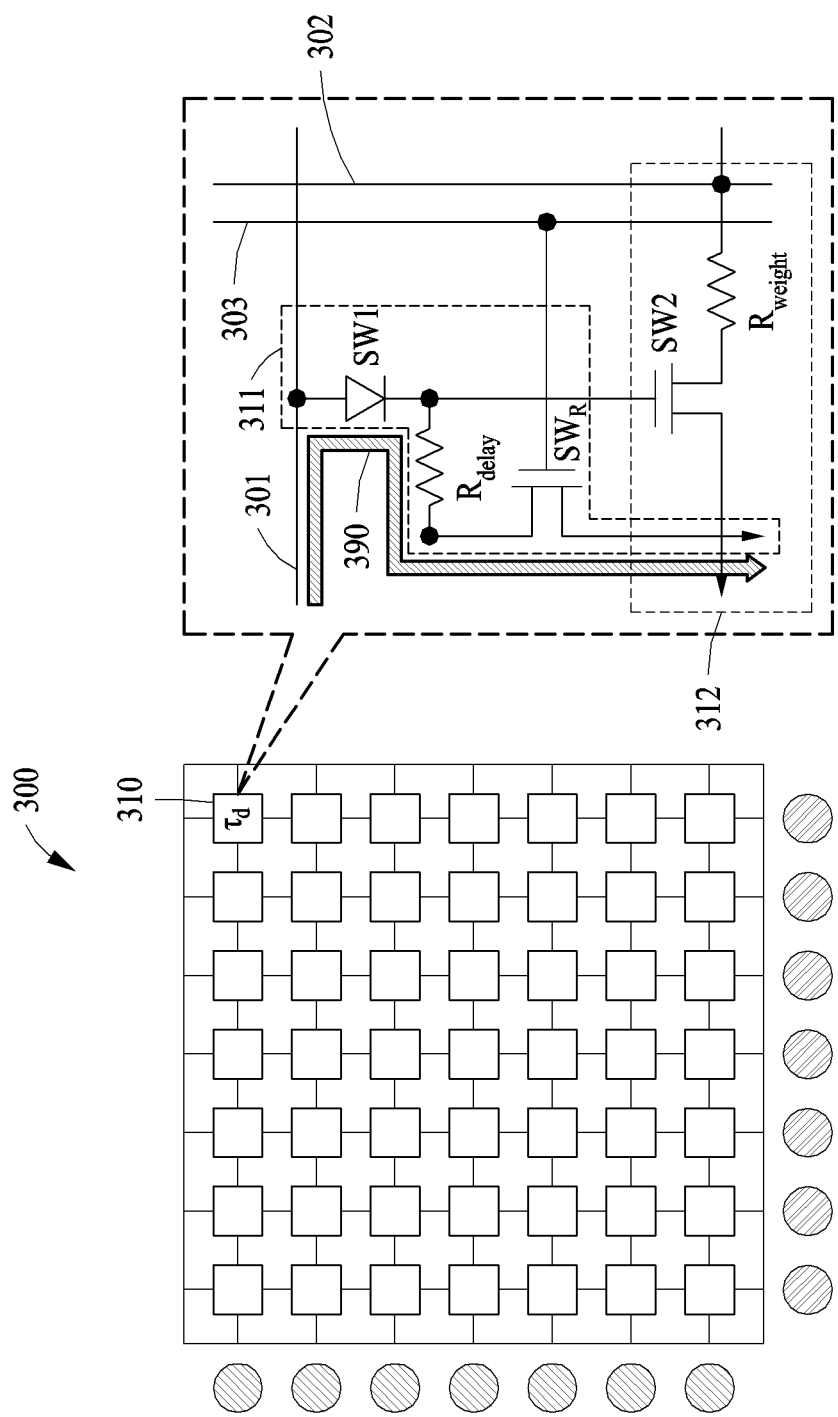
FIG. 3 illustrates an example of a memory cell included in a neuromorphic memory circuit.

FIG. 3 illustrates an example of a memory cell included in a neuromorphic memory circuit.

In a neuromorphic memory circuit 300 (e.g., the neuromorphic memory circuit 200 of FIG. 2), at least one memory cell 310 (e.g., the memory cell 210 of FIG. 2) of a plurality of memory cells may include a resistance setting switch SWR connected in series to a first resistive memory element $R_{delay}$. An input line 301, an output line 302, and a synapse circuit 312 are as described above with reference to FIG. 2.

For example, the resistance setting switch SWR may be connected in series between the first resistive memory element $R_{delay}$ and a ground. The resistance setting switch SWR may be, for example, a transistor, and a gate of the resistance setting switch SWR may be connected to a resistance setting line 303. The neuromorphic memory circuit 300 may set the resistance of the first resistive memory element $R_{delay}$ of a delay circuit 311 (e.g., the delay circuit 211 of FIG. 2) through activation of the resistance setting switch SWR.

When setting the resistance of the first resistive memory element $R_{delay}$ is required, the neuromorphic memory circuit 300 may apply a setting activation signal to the resistance setting switch SWR. The resistance setting switch SWR may receive the setting activation signal through the resistance setting line 303. The setting activation signal may be a control signal to turn on or turn off the resistance setting switch SWR for activating setting the resistance of the first resistive memory element $R_{delay}$. In response to the setting activation signal being received, the resistance setting switch SWR may form an electrical path 390 for setting the resistance of the first resistive memory element $R_{delay}$, the electrical path 390 traveling from the input line 301 through the first switching element SW1 and the first resistive memory element $R_{delay}$. The resistance setting signal (e.g., a pulse signal) may be applied to the first resistive memory element $R_{delay}$ through the input line 301 along the electrical path 390 for setting the resistance. The resistance of the first resistive memory element $R_{delay}$ may be set and/or programmed according to the resistance setting signal applied to the first resistive memory element $R_{delay}$.

Figure 7:
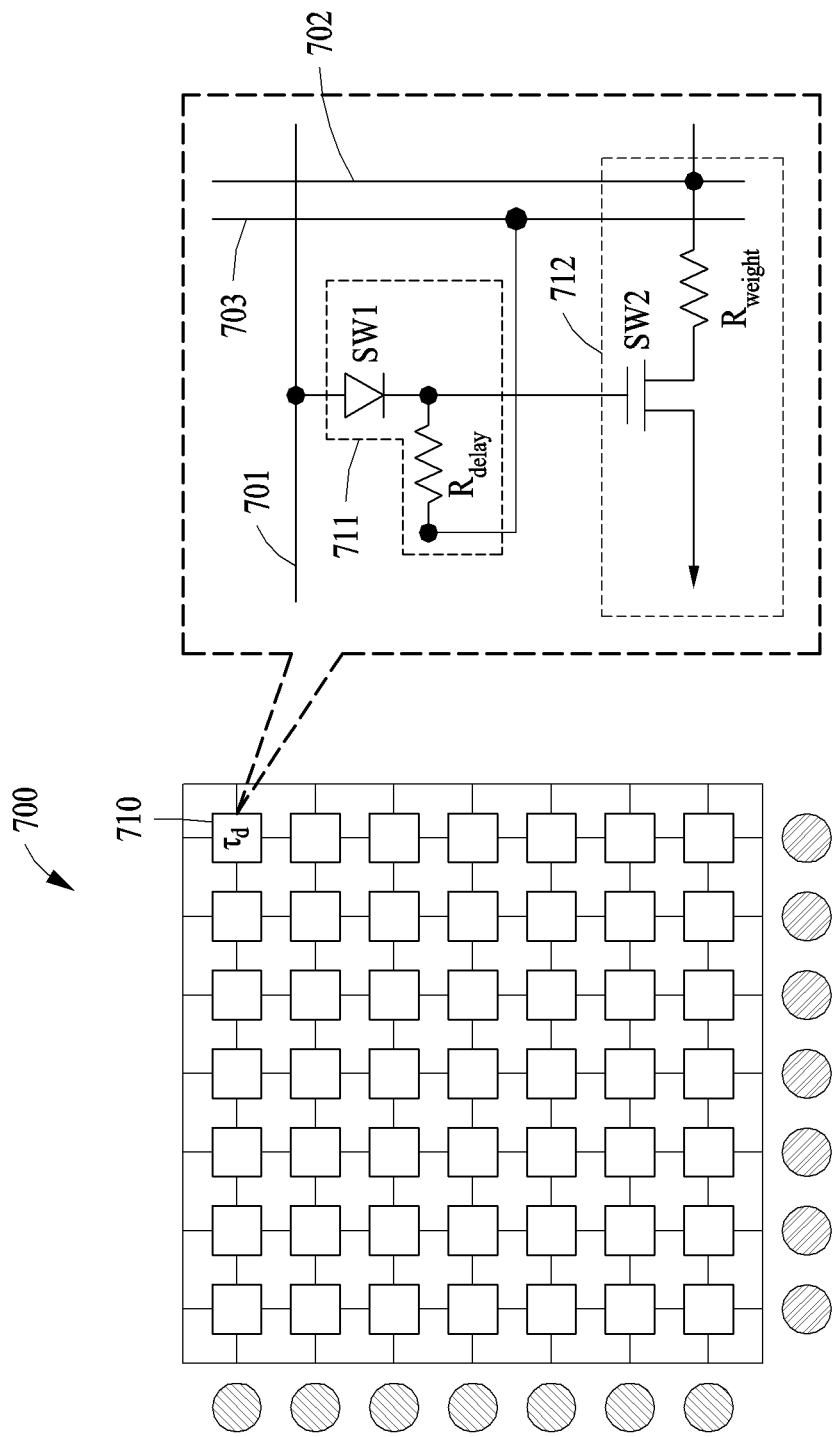
FIG. 7 illustrates an example of a structure for setting a resistance of a first resistive memory element without an additional switch in a neuromorphic memory circuit.

The resistance of the first resistive memory element $R_{delay}$ may be set based on one a waveform, a width, a period, a repetition number, a pulse interval, and an amplitude of the resistance setting signal received through the input line 301, or a combination of two or more thereof. The pulse of the resistance setting signal may be determined according to a type of the first resistive memory element $R_{delay}$. For example, when the first resistive memory element $R_{delay}$ is a phase change memory element, the resistance of the first resistive memory element $R_{delay}$ may be reduced in response to a resistance setting signal with a pulse with long pulse width and small amplitude. Conversely, the resistance of the first resistive memory element $R_{delay}$ may be increased in response to a resistance setting signal having a pulse with short pulse width and large amplitude. However, the examples are not limited to providing the resistance setting signal through the input line 301, and the resistance setting signal may also be provided through the resistance setting line 303 as shown in FIG. 7 and described below.

The neuromorphic memory circuit 300 may adjust fire delays between individual synaptic connections, thereby performing operations and/or computations mimicking fine operations of biological nerves. The neuromorphic memory circuit 300 may be designed with analog elements and switching elements that can be highly integrated, and may be implemented as a high-density synaptic array. The delay circuit 311 of the neuromorphic memory circuit 300 may have increased area-to-efficiency compared to a CMOS-based delay circuit.

Figure 4:
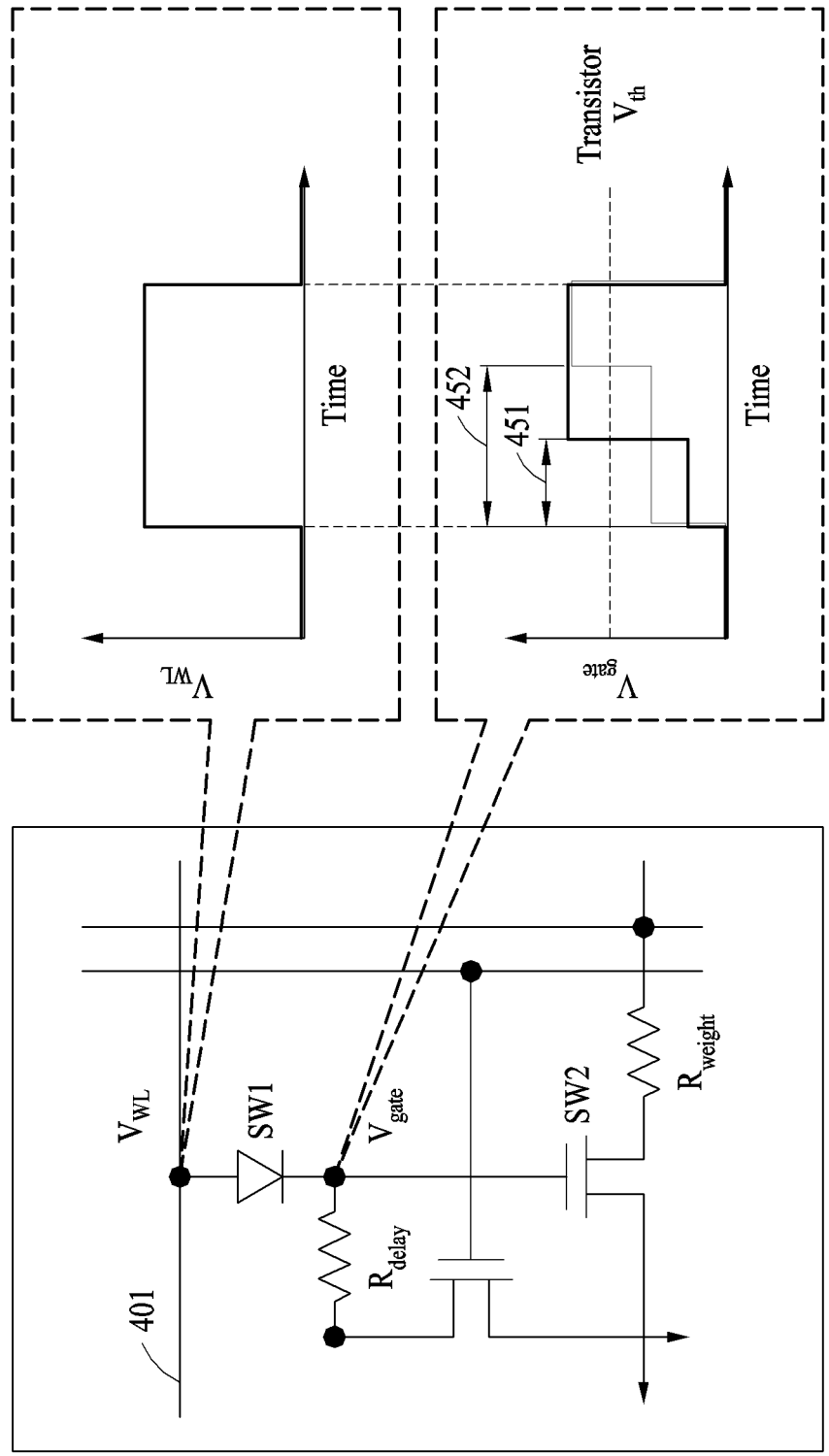
FIGS. 4 and 5 illustrate an example of an operation of a first switching element.
Figure 5:
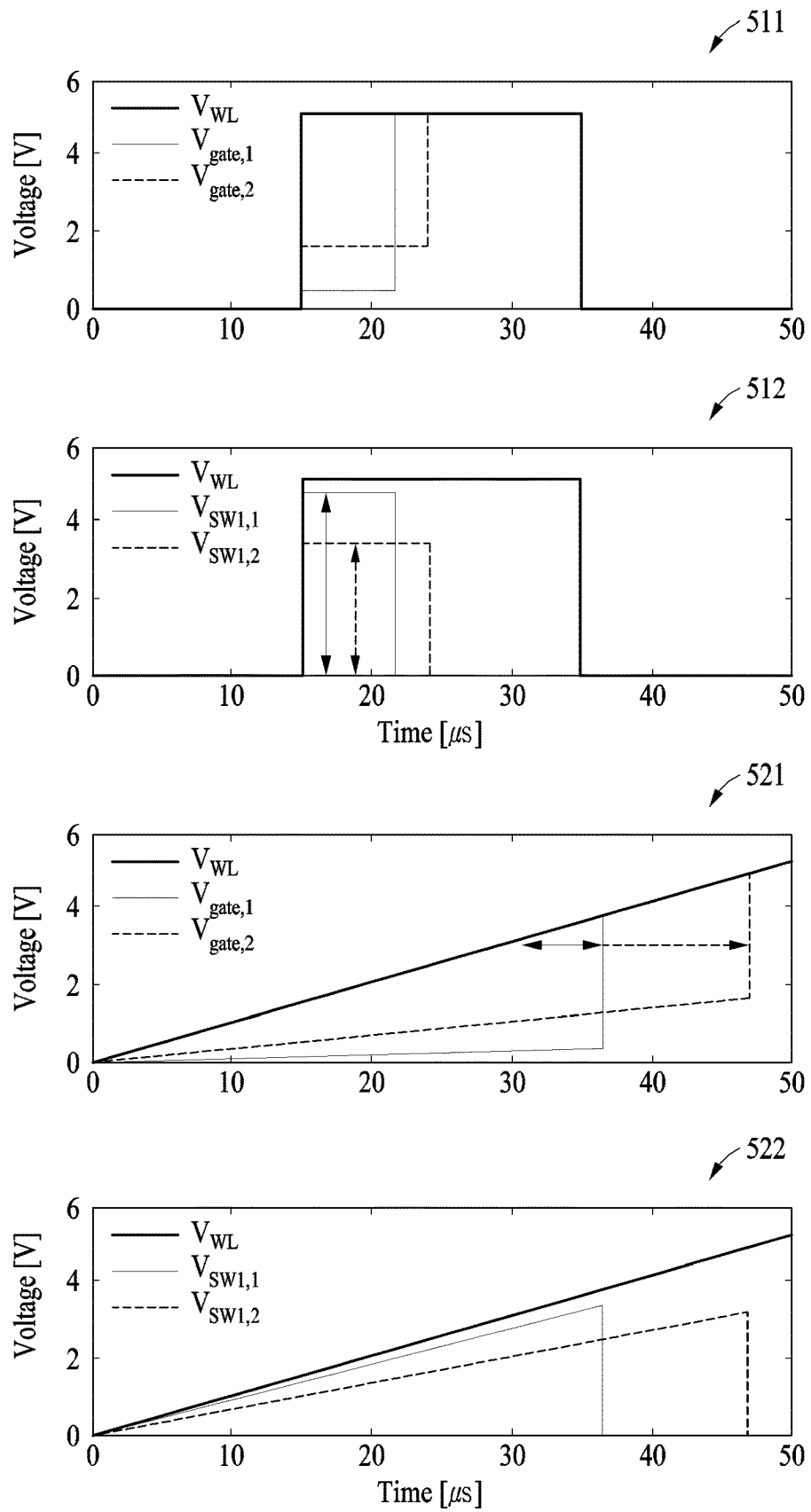

FIGS. 4 and 5 illustrate an example of an operation of a first switching element.

A first switching element SW1 may receive an input signal through an input line 401. The first switching element SW1 may have a threshold switching time determined based on a voltage $V_{SW1}$ applied to both ends thereof, as described above.

A resistance of the first switching element SW1 may be greater than a resistance of a first resistive memory element $R_{delay}$ until the threshold switching time elapses from a point in time at which the first switching element SW1 receives the input signal. The voltage $V_{SW1}$ applied to both ends of the first switching element SW1 may have a relatively large value, and an output voltage $V_{gate}$ of the first switching element SW1 may have a relatively small value.

The resistance of the first switching element SW1 may become less than the resistance of the first resistive memory element in response to an elapse of the threshold switching time from the point in time at which the input signal is received. After the threshold switching time elapses, the resistance of the first switching element SW1 may rapidly decrease, and a gate voltage of a transistor, a second switching element SW2 connected to an output line, may increase. Of a voltage (e.g., a word line voltage $V_{WL}$) corresponding to the input signal, the voltage $V_{SW1}$ applied to both ends of the first switching element SW1 may be reduced according to voltage division. Thus, the voltage $V_{gate}$ output from the first switching element SW1 may increase, whereby the input signal may be transmitted to a synapse circuit. For example, when the voltage $V_{gate}$ output from the first switching element SW1 is higher than a threshold voltage of the transistor, which is the second switching element SW2, the input signal may be transmitted to the synapse circuit. The synapse circuit may provide an output in response to the input signal delayed by the threshold switching time, and the neuromorphic memory circuit may output a neuron fire according to a weighted sum of outputs of synapse circuits of memory cells connected to the same output line. In other words, the neuron fire may be delayed by the threshold switching time.

For example, the first switching element SW1 may include one of an ovonic threshold switch (OTS), a switching element including a metal-insulator transition (MIT) material, a switching element including a mixed-ionic-electronic conduction material, and a metal-insulator-metal (MIM) switching element, or a combination of two or more thereof. The OTS may include, for example, an element including a chalcogenide-based oxide (e.g., GeSe) or one oxide of niobium (Nb), tantalum (Ta), and vanadium (V).

As described above, the threshold switching time may correspond to a time required for the transition of the resistance of the first switching element SW1 from a first resistance to a second resistance. The second resistance may be smaller than the first resistance. As described above, the threshold switching time of the first switching element SW1 may vary depending on the voltage applied to both ends of the first switching element SW1. As the voltage applied to both ends of the first switching element SW1 increases, the threshold switching time may decrease. Conversely, as the voltage applied to both ends of the first switching element SW1 decreases, the threshold switching time may increase. As described above, since the voltage applied to both ends of the first switching element SW1 varies according to the resistance value of the first resistive memory element $R_{delay}$, the occurrence of resistance transition of the first switching element SW1 may be delayed or expedited by the resistance value of the first resistive memory element $R_{delay}$.

For example, when the voltage applied to the first switching element SW1 in response to the input signal is a first voltage, the first switching element SW1 may output the input signal delayed by a first threshold time 451. When the voltage applied to the first switching element SW1 in response to the input signal is a second voltage less than the first voltage, the first switching element SW1 may output the input signal delayed by a second threshold time 452 greater than the first threshold time 451. With reference to FIG. 5 below, changes in the voltage $V_{SW}$ applied to both ends of the first switching element SW1 and the output voltage $V_{gate}$ of the first switching element SW1 over time in an example of an input signal having a rectangular waveform and an example of an input signal having a triangular waveform will be described.

FIG. 5 shows an output voltage 511 of the first switching element SW1 and a voltage 512 applied between both ends of the first switching element SW1 when the first switching element SW1 receives a rectangular-waveform pulse through an input line. For example, when the voltage applied to the first switching element SW1 is a first voltage $V_{SW1,1}$ (e.g., a relatively high voltage), the first switching element SW1 may output a first output voltage $V_{gate,1}$. As another example, when the voltage applied to the first switching element SW1 is a second voltage $V_{SW1,2}$ (e.g., a relatively low voltage), the first switching element SW1 may output a second output voltage $V_{gate,2}$. When the first voltage $V_{SW1,1}$ is higher than the second voltage $V_{SW1,2}$, the first switching element SW1 to which the first voltage $V_{SW1,1}$ is applied may have a shorter threshold switching time than the first switching element SW1 to which the second voltage $V_{SW1,2}$ is applied, as shown in FIG. 5. In other words, a transition of the second output voltage $V_{gate,2}$ may be later than a transition of the first output voltage $V_{gate,1}$.

FIG. 5 further shows an output voltage 521 of the first switching element SW1 and a voltage 522 applied between both ends of the first switching element SW1 when the first switching element SW1 receives a triangular-waveform pulse through an input line. Regardless of the waveform of the pulse, as the voltage applied to both ends of the first switching element SW1 increases, the threshold switching time of the first switching element SW1 may decrease.

Thus, a neuromorphic memory circuit may adjust the threshold switching time according to the voltage applied to both ends of the first switching element SW1. As described above, the threshold switching time of the first switching element SW1 may be finely adjusted by adjusting a variable resistance of a first resistive memory element connected in series thereto.

For reference, the various examples described herein principally describe an example in which the threshold switching time changes by the voltage applied to both ends of the first switching element SW1. However, examples are not limited thereto. The first switching element SW1 may be an element whose switching characteristics change by the voltage applied to both ends thereof. For example, one of the threshold switching time, a switching probability, and a turn-off time of the first switching element SW1 or a combination of two or more thereof may change by the voltage applied to both ends of the first switching element SW1. The switching probability may be a probability that a turn-on of the first switching element SW1 is caused. The turn-off time may be a time used until the first switching element SW1 is turned on again after being turned off.

Figure 6:
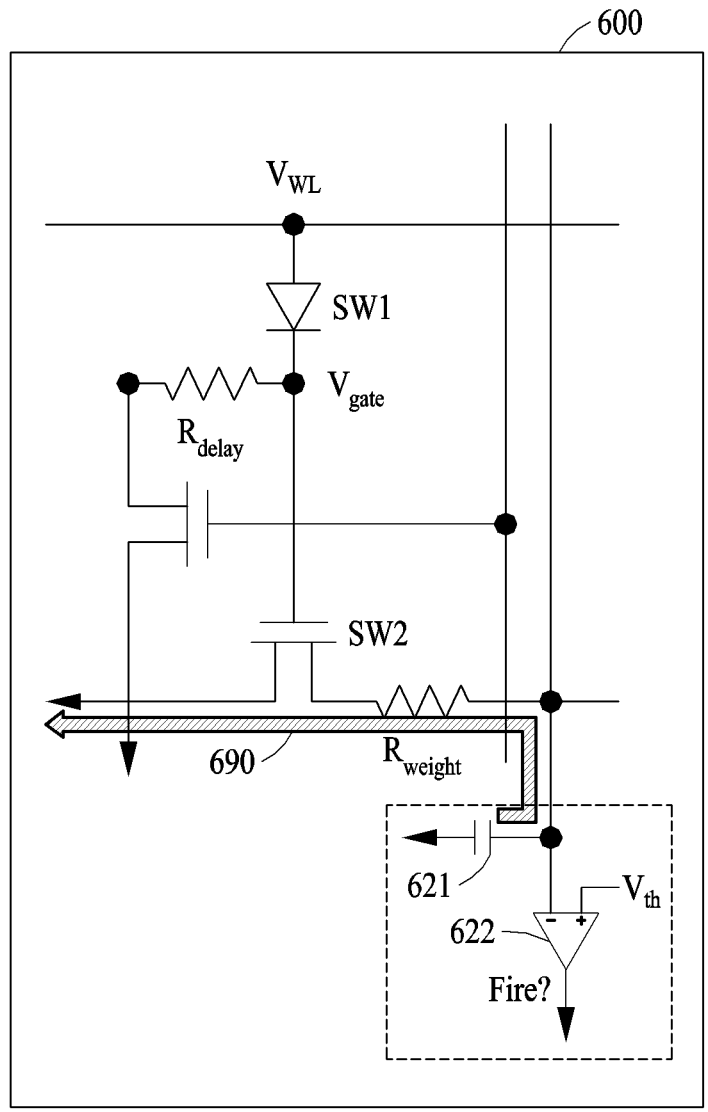
FIG. 6 illustrates an example of a neuromorphic memory circuit implemented as a spiking neural network (SNN).

FIG. 6 illustrates an example of a neuromorphic memory circuit implemented as a spiking neural network (SNN).

Referring to FIG. 6, a neuromorphic memory circuit 600 may be implemented as a spike-based neural network circuit including a capacitor 621 and a comparator 622. The capacitor 621 and the comparator 622 may also be referred to as a post-synapse circuit. FIG. 6 shows the capacitor 621 and the comparator 622 corresponding to one output line, wherein two or more memory cells on the output line may be connected to the capacitor 621 and the comparator 622 corresponding to the output line.

The capacitor 621 may be connected to an output of a synapse circuit. Electric charge stored in the capacitor 621 may correspond to membrane potential. The electric charge stored in the capacitor 621 may move to a ground along a path 690 formed when a second switching element SW2 included in the synapse circuit is activated. The electric charge stored in the capacitor 621 may be removed by an activated synapse circuit among synapse circuits of two or more memory cells connected to the same output line. In other words, the electric charge stored in the capacitor 621 may be removed through currents induced by the second switching element SW2 receiving an input signal and a second resistive memory element $R_{weight}$ corresponding to a weight. The voltage of the capacitor 621 discharged according to results output from one or more memory cells disposed on one output line may correspond to a weighted sum of weight values and input value for the output line.

The comparator 622 may be connected to the output of the synapse circuit and the capacitor 621. The comparator 622 may output a neuron fire signal based on a comparison between the voltage according to the electric charge stored in the capacitor 621 and a threshold voltage $V_{th}$. The comparator 622 may output the neuron fire signal in response to the voltage according to the electric charge stored in the capacitor 621 being less than the threshold voltage $V_{th}$. The neuron fire signal may be transmitted to a neuron circuit of a subsequent layer. Although FIG. 6 shows a circuit implementation according to an example leaky integrated-and-fire (LIF) model, examples are not limited to such a configuration. Various signal transmission schemes of a neuromorphic memory circuit may be implemented by the neuromorphic memory circuit 600.

FIG. 7 illustrates an example of a structure for setting a resistance of a first resistive memory element without an additional switch in a neuromorphic memory circuit.

Referring to FIG. 7, in a memory cell 710 of a neuromorphic memory circuit 700, a first resistive memory element $R_{delay}$ of a delay circuit 711 may be connected to a resistance setting line 703. In FIG. 7, unlike the example shown in FIG. 4, the first resistive memory element $R_{delay}$ may be connected to the resistance setting line 703 without a separate switch. The delay circuit 711, a synapse circuit 712, and an output line 702 are as described above. In a structure shown in FIG. 7, an area for implementing a unit memory cell may be reduced.

A resistance of the first resistive memory element $R_{delay}$ may be set in response to a resistance setting signal received through at least one of the input line 701 and the resistance setting line 703. For example, the neuromorphic memory circuit 700 may program the resistance of the first resistive memory element $R_{delay}$ through at least one of a pulse applied to the input line 701 and/or a pulse applied to the resistance setting line 703. An example of a pulse for setting the resistance of the first resistive memory element $R_{delay}$ is as described with reference to FIG. 3.

Figure 8:
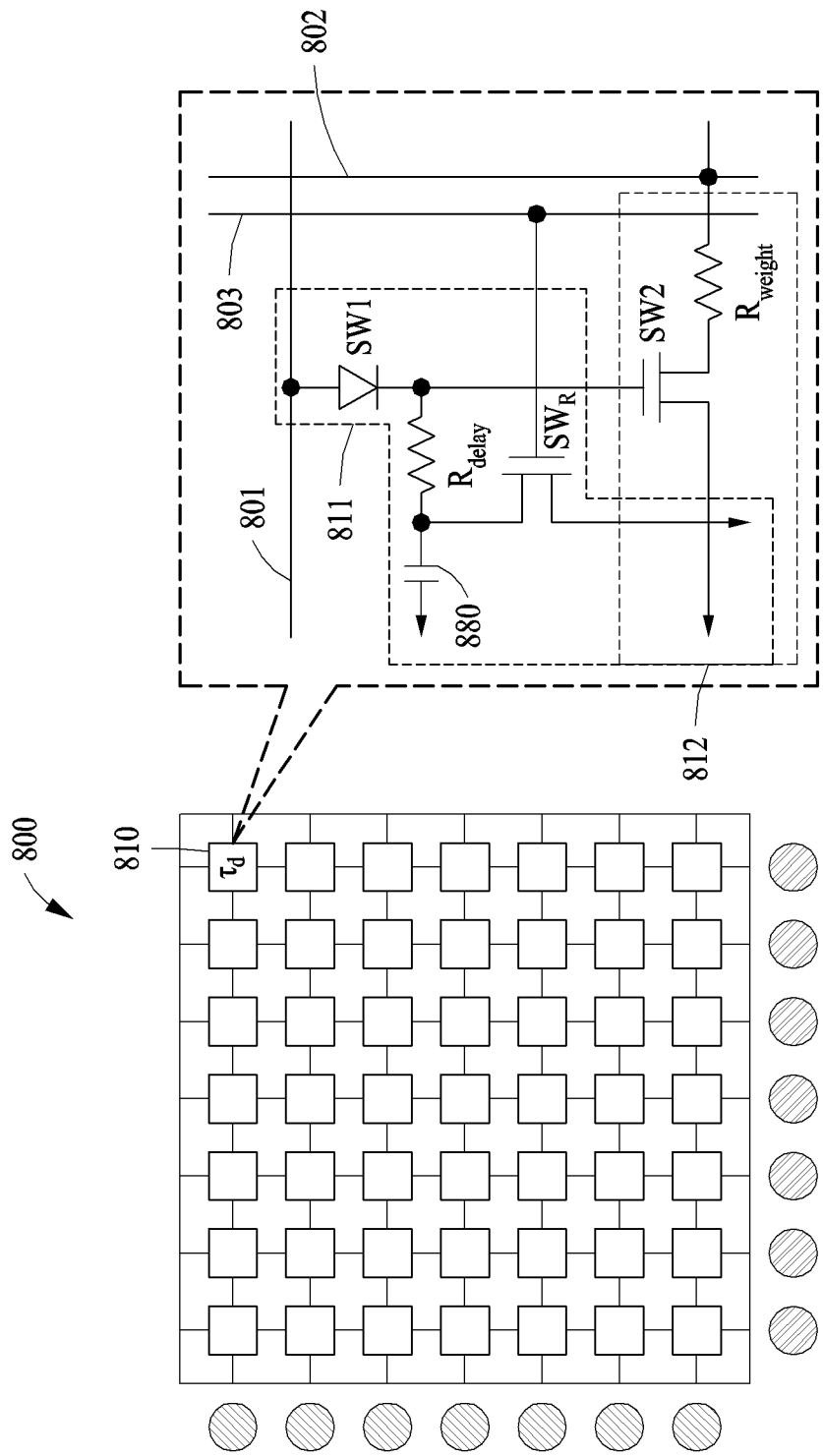
FIGS. 8 and 9 illustrate examples of a capacitor for extending a turn-on time of a first switching element in a neuromorphic memory circuit.
Figure 9:
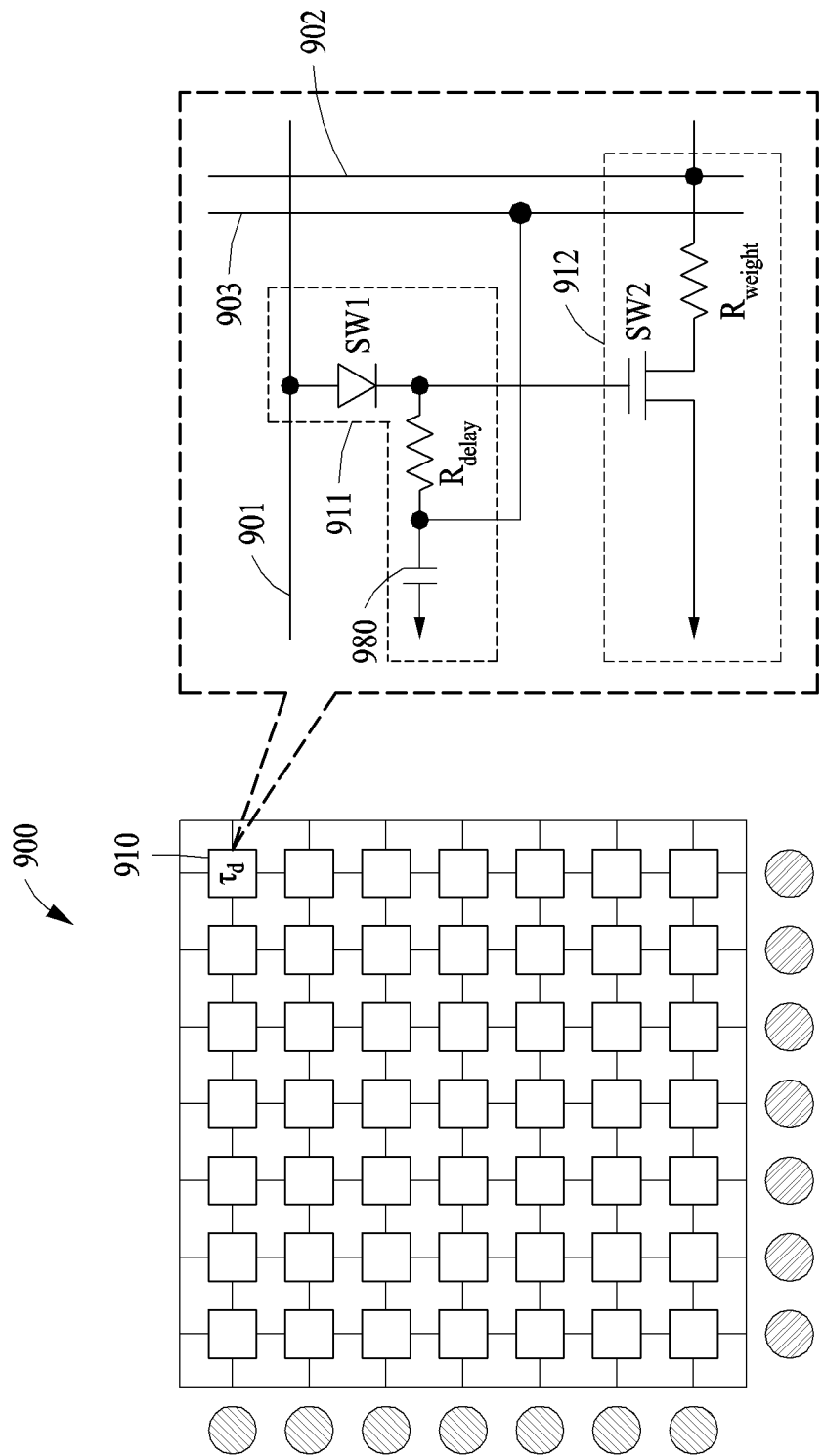

FIGS. 8 and 9 illustrate examples of a capacitor for extending a turn-on time of a first switching element in a neuromorphic memory circuit.

Referring to FIGS. 8 and 9, a memory cell 810, 910 of a neuromorphic memory circuit 800, 900 may further include a hold capacitor 880, 980 connected to an output of a first switching element SW1. The hold capacitor 880, 980 may be connected in series between the first switching element SW1 and a ground.

The hold capacitor 880, 980 may maintain a voltage applied to the first switching element SW1 to be larger than or equal to a hold voltage, while the first switching element SW1 is receiving an input signal from an input line 801, 901. FIG. 8 shows an example in which the hold capacitor 880 is added to the neuromorphic memory circuit 300 of FIG. 3, and FIG. 9 shows an example in which the hold capacitor 980 is added to the neuromorphic memory circuit 700 of FIG. 7. The delay circuit 811, 911, a synapse circuit 812, 912, an output line 802, 902, and a resistance setting line 803, 903 are as described above with reference to FIGS. 3 and 7.

The hold capacitor 880, 980 connected to a rear end of the first switching element SW1 may prevent the voltage applied to both ends of the first switching element SW1 from rapidly changing after a transition of the resistance of the first switching element SW1 occurs. When a rapid voltage drop occurs, the first switching element SW1 may be turned off. The hold capacitor 880, 980 may maintain an output voltage $V_{gate}$ of the first switching element SW1 to be higher than a threshold voltage $V_{th}$ of a comparator. Thus, the hold capacitor 880, 980 may prevent oscillation during the progress of a voltage pulse received through the input line 801, 901 and extend a turn-on time of the first switching element SW1, thereby transmitting an input signal to the synapse circuit 812, 912 in a more intact form.

After the transmission of the input signal to the synapse circuit 812, 912 is completed, the resistance of the first switching element SW1 may be restored. For example, the resistance of the first switching element SW1 may be changed from a default resistance value to a reduced resistance value in response to an elapse of a threshold switching time after the input signal is received. The resistance of the first switching element SW1 may return from the reduced resistance value to the default resistance value in response to the voltage applied to the first switching element SW1 being less than the hold voltage.

Figure 10:
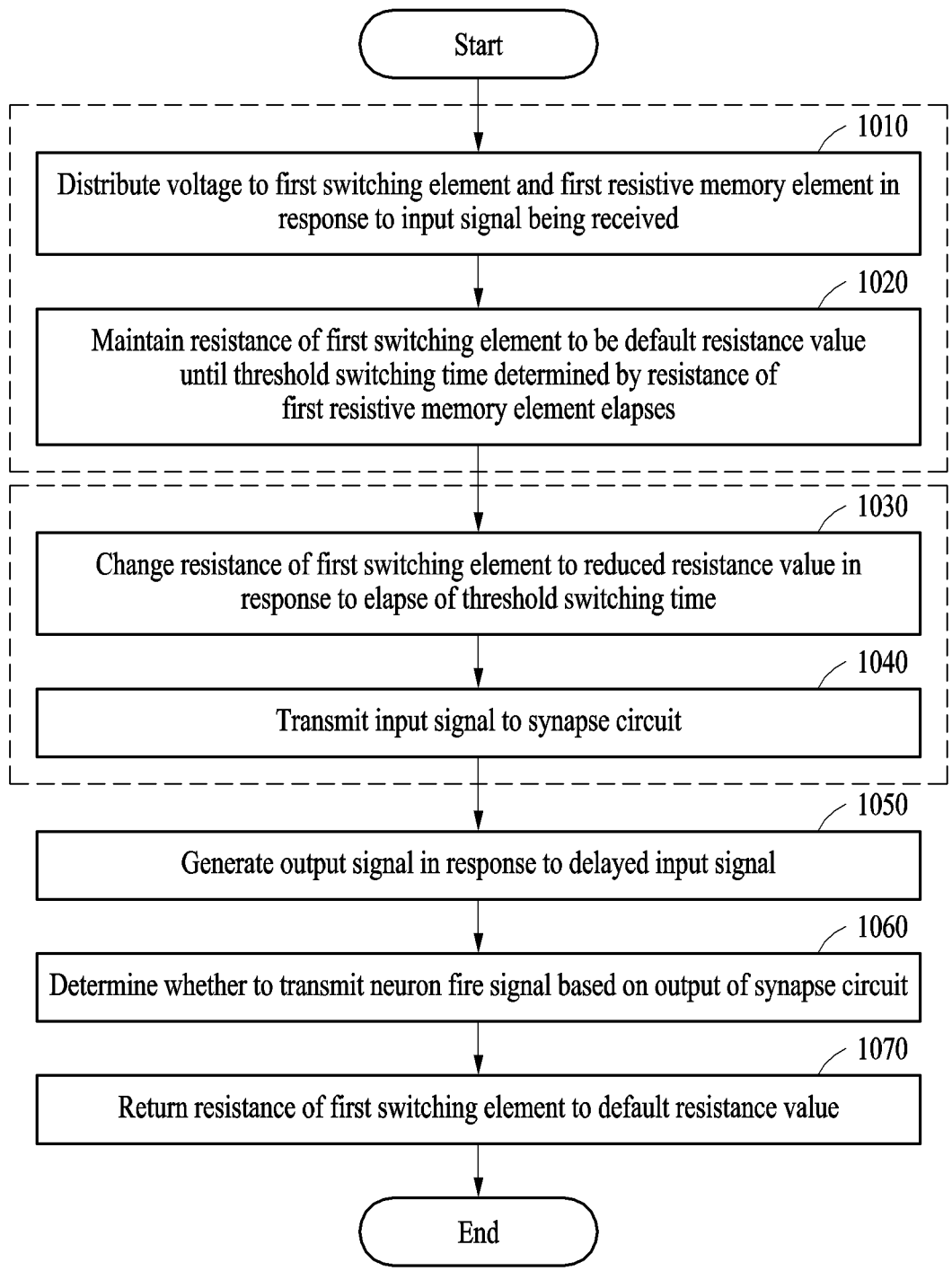
FIG. 10 illustrates an example of an operating method of a neuromorphic memory circuit.

FIG. 10 illustrates an example of an operating method of a neuromorphic memory circuit.

First, in operation 1010, a neuromorphic memory circuit may distribute a voltage corresponding to an input signal to a first switching element and a first resistive memory element in response to the input signal being received by a memory cell. As described above, switching characteristics (e.g., a threshold switching time) of the first switching element may change according to a voltage applied to both ends thereof. The threshold switching time of the first switching element may be a time used for a transition of a resistance of the first switching element from a default resistance value to a reduced resistance value after the voltage is applied to both ends thereof.

In operation 1020, the neuromorphic memory circuit may maintain the resistance of the first switching element to be the default resistance value, until the threshold switching time determined by the resistance of the first resistive memory element elapses.

In operation 1030, in response to an elapse of the threshold switching time from a point in time at which the first switching element receives the input signal, the resistance of the first switching element may be changed to the reduced resistance value. The reduced resistance value may be less than the default resistance value.

In operation 1040, a delay circuit may transmit the input signal to a synapse circuit. For example, the first switching element of the delay circuit may transmit the input signal to the synapse circuit in response to an elapse of the threshold switching time determined based on the voltage applied to both ends of the first switching element from the point in time at which the input signal is received. The first switching element may provide the input signal to the synapse circuit after a transition to the reduced resistance value occurs in operation 1030. For example, when a voltage $V_{gate}$ output from the first switching element SW1 increases and becomes higher than a threshold voltage of a transistor, which is a second switching element, the input signal may be transmitted to the synapse circuit.

In operation 1050, the synapse circuit of the neuromorphic memory circuit may generate an output signal in response to the input signal delayed by the threshold switching time. The output signal generated by the synapse circuit may be, for example, a current signal for removing electric charge stored in a capacitor implemented to correspond to a membrane.

In operation 1060, a comparator of the neuromorphic memory circuit may determine whether to transmit a neuron fire signal based on the output of the synapse circuit. The neuromorphic memory circuit may include a crossbar array circuit, and the comparator may be a peripheral circuit of the crossbar array circuit. For example, as described above in FIG. 6, the comparator implemented as a part of the post-synapse circuit may determine whether to output the neuron fire signal based on a result of comparing the voltage of the capacitor and the threshold voltage.

In operation 1070, the resistance of the first switching element may return to the default resistance value. After the input signal is transmitted to the synapse circuit via the first switching element in operation 1060, the voltage applied to both ends of the first switching element may be reduced to be less than the hold voltage.

However, the operation of the neuromorphic memory circuit is not limited to the description provided with reference to FIG. 10. The neuromorphic memory circuit may perform one of the operations described with reference to FIGS. 1 to 9 or a combination of two or more thereof in parallel and/or in time series.

The neuromorphic memory circuit and other devices, apparatuses, units, modules, and components described herein with respect to FIGS. 1-9 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10, for example, that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computer.

A number of examples have been described above. Nevertheless, it should be understood that various modifications may be made to these examples. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A neuromorphic memory circuit comprising:
a plurality of memory cells,
wherein each of the plurality of memory cells comprises:
a first switching element configured to have a threshold switching time determined based on a voltage applied to both ends of the first switching element at a time of receiving an input signal, and to output the input signal in response to an elapse of the threshold switching time from a point in time at which the input signal is received;
a first resistive memory element connected to the first switching element and configured to divide the voltage applied to both ends of the first switching element;
a synapse circuit configured to generate an output signal in response to the input signal delayed by the threshold switching time; and
a capacitor connected to an output of the synapse circuit.

2. The neuromorphic memory circuit of claim 1, wherein each of the synapse circuits comprises:
a second switching element connected to the first switching element and the first resistive memory element; and
a second resistive memory element connected to the second switching element,
wherein the synapse circuit is configured to generate the output signal corresponding to a result of multiplication between an input value indicated by the input signal and a weight value corresponding to a resistance of the second resistive memory element.

3. The neuromorphic memory circuit of claim 1, wherein the plurality of memory cells includes at least a first memory cell and a second memory cell, and a threshold switching time of the first memory cell is different than a threshold switching time of the second memory cell.

4. The neuromorphic memory circuit of claim 1, wherein
two or more memory cells, of the plurality of memory cells, disposed on a same input line are configured to receive a same input signal, and
a threshold switching time of at least one memory cell of the two or more memory cells is different from a threshold switching time of another memory cell on the same input line.

5. The neuromorphic memory circuit of claim 1, wherein one or more of the first switching elements comprises one of an ovonic threshold switch (OTS), a switching element including a metal-insulator transition (MIT) material, a switching element including a mixed-ionic-electronic conduction material, and a metal-insulator-metal (MIM) switching element, or a combination of two or more thereof.

6. The neuromorphic memory circuit of claim 1, wherein one or more of the first resistive memory elements comprises a variable resistor.

7. The neuromorphic memory circuit of claim 1, wherein one or more of the first resistive memory elements comprises one of a phase change memory element, a resistive random access memory (ReRAM) element, a MIM variable resistor element, an electrochemical memory element, a conductive filament memory element, a capacitor, a dynamic RAM (DRAM), and a magnetic random access memory (MRAM) element, or a combination of two or more thereof.

8. The neuromorphic memory circuit of claim 1, wherein at least one memory cell of the plurality of memory cells comprises a resistance setting switch connected in series to the first resistive memory element.

9. The neuromorphic memory circuit of claim 8, wherein the resistance setting switch is configured to form an electrical path for setting a resistance of the first resistive memory element, the electrical path being disposed from an input line through the first switching element and the first resistive memory element, in response to a setting activation signal being received.

10. The neuromorphic memory circuit of claim 9, wherein the resistance of the first resistive memory element is set based on one a waveform, a width, a period, a repetition number, a pulse interval, and an amplitude of a resistance setting signal received through the input line, or a combination of two or more thereof.

11. The neuromorphic memory circuit of claim 1, wherein at least one of the memory cells further comprises:
a comparator connected to the output of the synapse circuit and the capacitor and configured to output a neuron fire signal based on a comparison between a voltage according to electric charge stored in the capacitor and a threshold voltage.

12. The neuromorphic memory circuit of claim 11, wherein the electric charge stored in the capacitor is removed by an activated synapse circuit among synapse circuits of two or more memory cells connected on a same output line.

13. The neuromorphic memory circuit of claim 1, wherein the first resistive memory element is connected to a resistance setting line, and
a resistance of the first resistive memory element is set in response to a resistance setting signal received through at least one of an input line and the resistance setting line.

14. The neuromorphic memory circuit of claim 1, wherein at least one of the memory cells further comprises:
a hold capacitor connected to an output of the first switching element.

15. The neuromorphic memory circuit of claim 14, wherein the hold capacitor is configured to maintain the voltage applied to the first switching element to be greater than or equal to a hold voltage while the first switching element receives the input signal.

16. The neuromorphic memory circuit of claim 1, wherein at least one of the first switching elements is configured to:
output the input signal delayed by a first threshold time in a case in which the voltage applied to the first switching element in response to the input signal is a first voltage, and
output the input signal delayed by a second threshold time that is greater than the first threshold time in a case in which the voltage applied to the first switching element in response to the input signal is a second voltage that is less than the first voltage.

17. The neuromorphic memory circuit of claim 1, wherein a resistance of the first switching element becomes less than a resistance of the first resistive memory element in response to an elapse of the threshold switching time from the point in time at which the input signal is received.

18. The neuromorphic memory circuit of claim 1, wherein a resistance of the first switching element is changed from a default resistance value to a reduced resistance value in response to an elapse of the threshold switching time after the input signal is received, and returns from the reduced resistance value to the default resistance value in response to the voltage applied to the first switching element being less than a hold voltage.

19. A neuromorphic memory circuit comprising:
a first memory cell comprising a first synapse circuit, and a first delay circuit configured to delay transmission of an input to the first synapse circuit by a first threshold switching time;
a second memory cell comprising a second synapse circuit, and a second delay circuit configured to delay transmission of an input to the second synapse circuit by a second threshold switching time different from the first threshold switching time; and
a capacitor connected to an output of at least one of the first synapse circuit and the second synapse circuit.

20. An operating method of a neuromorphic memory circuit, the operating method comprising:
distributing a voltage corresponding to an input signal to a first switching element and a first resistive memory element in response to the input signal being received by a memory cell;
transmitting the input signal to a synapse circuit in response to an elapse of a threshold switching time determined based on a voltage applied to both ends of the first switching element from a point in time at which the input signal is received;
generating an output signal by the synapse circuit in response to the input signal delayed by the threshold switching time; and
outputting the output signal of the synapse circuit to a comparator to output a neuron fire signal based on a comparison between a voltage according to electric charge stored in a capacitor and a threshold voltage.

\* \* \* \* \*